United States Patent [19]

Herr et al.

[11] 4,295,118
[45] Oct. 13, 1981

[54] LATCHING RELAY USING HALL EFFECT DEVICE

[75] Inventors: John A. Herr, Garwood; Bruce R. Rogan, Somerville, both of N.J.

[73] Assignee: The Singer Company, Stamford, Conn.

[21] Appl. No.: 152,210

[22] Filed: May 21, 1980

[51] Int. Cl.³ .......................................... H01L 43/04
[52] U.S. Cl. .................. 338/32 H; 323/294; 324/251; 335/179; 335/207
[58] Field of Search ............... 338/32 H, 32 R, 43, 338/103, 116; 307/309; 323/94 H, 368; 324/251, 252; 335/2, 207, 179; 340/365 L; 329/200

[56] References Cited

U.S. PATENT DOCUMENTS

| 3,158,761 | 11/1964 | Bullock | 307/309 X |
| 3,261,944 | 7/1966 | Sherwood | 335/207 X |
| 3,419,731 | 12/1968 | Wheable et al. | 335/207 X |
| 3,534,307 | 10/1970 | Spewock et al. | 335/170 |
| 3,590,134 | 6/1971 | Ogi | 338/32 R X |
| 3,622,922 | 11/1971 | Moci | 335/2 |
| 3,633,145 | 1/1972 | Ohno | 338/32 R X |
| 3,671,893 | 6/1972 | Edgar et al. | 335/179 |
| 3,824,512 | 7/1974 | Glass | 335/205 |
| 3,873,957 | 3/1975 | Würscher et al. | 338/324 |
| 3,914,723 | 10/1975 | Goodbar | 375/79 |
| 3,950,719 | 4/1976 | Maxwell | 335/207 X |

Primary Examiner—C. L. Albritton
Attorney, Agent, or Firm—Edward P. Schmidt; Robert E. Smith; Edward L. Bell

[57] ABSTRACT

A Hall effect switch device converted to a latching relay by having a reversible bias magnet attached thereto adjacent the Hall sensor so as to operate the switch circuit in one polarity of the bias magnet, and release the switch circuit in the other polarity of the bias magnet.

6 Claims, 7 Drawing Figures

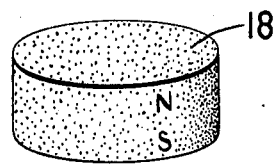
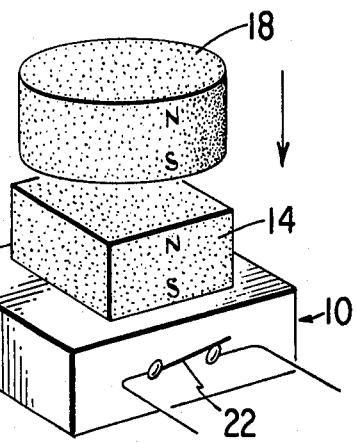
Fig.2 Fig.3
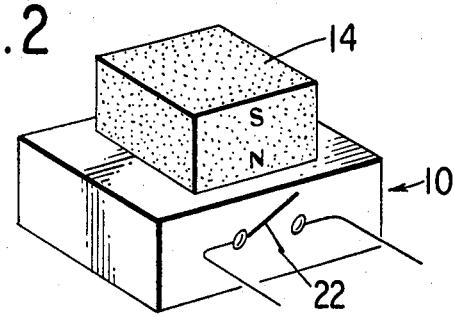
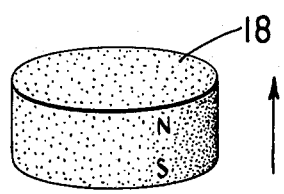
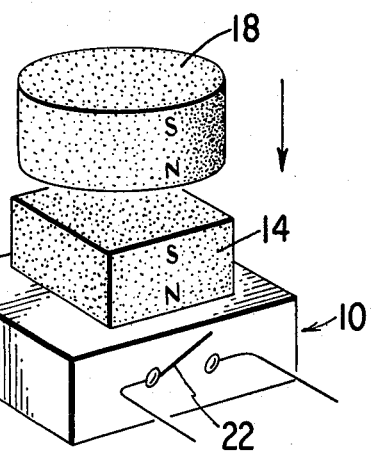
Fig.4 Fig.5
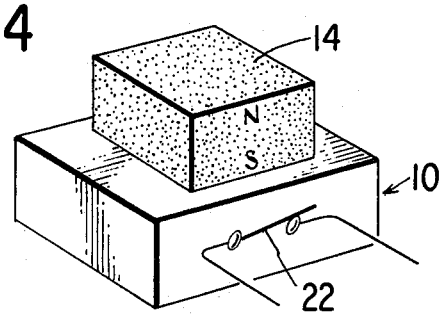
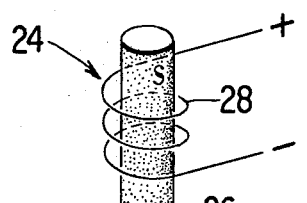
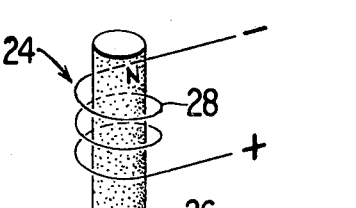
Fig.6 Fig.7
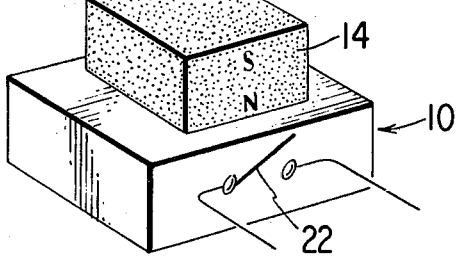
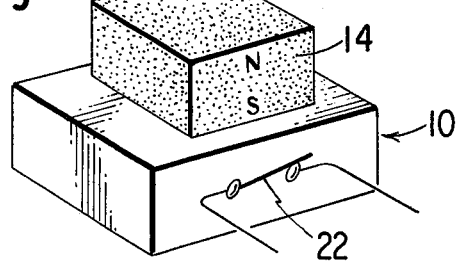

LATCHING RELAY USING HALL EFFECT DEVICE

DESCRIPTION

BACKGROUND OF THE INVENTION

This invention relates to a latching relay; more particularly, to a contactless latching relay utilizing a Hall effect device.

The invention provides a way to make a contactless Hall effect switching device into a relay which will retain its switch orientation until deliberately changed. In commercially available Hall effect switching devices, a Hall element is provided together with circuitry to effect a switching function. These prior art devices are further provided with signal conditioners which include, as a minimum, a step function generator with hysteresis. Thus, a Hall effect switching device is provided with a positive ON or OFF level in the middle of a step as an aid to positive operation of the switch function; and, with sufficient spacing between the ON and OFF level to eliminate problems from small variations of the actuating signal.

The prior art also includes a latching magnetic relay in which the Hall effect sensor is combined with an integrated circuit and requires a south pole to operate it and a north pole to release it. However, these devices are relatively expensive. What is required is a simple and inexpensive device which may be readily converted to latching operation.

SUMMARY OF THE INVENTION

The above requirement is achieved in a Hall effect switch device in which a reversible bias magnet is affixed adjacent the Hall sensor. The bias magnet operates on the Hall sensor to maintain a given voltage level, and special circuitry associated with the Hall sensor responds to that voltage level to perform a switching function. By reversing the polarity of the bias magnet, a different voltage level will be maintained by the Hall sensor to which the circuitry will respond by accomplishing the converse of the switching function. The polarity of the bias magnet may be changed by moving a strong operating magnet into position. Alternatively, a DC electromagnet may be permanently located adjacent the bias magnet and current flow therethrough may be reversed to change the polarity of the bias magnet.

DESCRIPTION OF THE DRAWINGS

For a better understanding of the invention, reference may be had to the specification and the attached drawings in which:

FIG. 2 indicates in diagrammatic form the latching device of the invention maintained in one state by a bias magnet;

FIG. 3 indicates the latching device of FIG. 2 with an operating magnet moved into a position to reverse the bias magnet and change the state of the device;

FIG. 4 indicates the latching device of FIG. 3 with the operating magnet removed therefrom;

FIG. 5 indicates the latching device of FIG. 4 with the operating magnet moved into a position to once again reverse the bias magnet and change the state of the device;

FIG. 6 indicates the latching device with an electromagnet for reversing the polarity of the bias magnet; and, FIG. 7 indicates how by changing the direction of current in the electromagnet, the polarity of the bias magnet may be changed, and thereby the state thereof.

Referring now to FIG. 1 there is shown in block diagrammatic form, a Hall effect switch device 10 to which a bias magnet 14 is attached, the switch device having a Hall sensor 12 and a switching circuit 16. The magnetic field of the bias magnet 14 influences the Hall sensor 12 to provide an output voltage which initiates and maintains a switching function in the switching circuit 16. Current is supplied to the Hall sensor 12 along lines 13 from a constant current source (not shown). (The Hall effect switch device may be implemented by a microswitch type 512S516, a product of Microswitch, Freeport, Ill.) To change the state of the Hall effect switch device 10, an operating magnet 18 may be provided which may be a large permanent magnet or an electromagnet. The bias magnet 14 should be reversible so that the state of the Hall effect switch device may be changed from operated to released, or vice versa, by moving the operating magnet 18 into and out of a position where its magnetic field will influence the bias magnet to change polarity. The switching circuit 16 may be any device or circuit which responds to varying voltage levels to open or close a circuit on lines 20. In general, the switching circuit 16 should provide the capability for just two discrete levels regardless how slowly the output of the Hall sensor 12 varies. Thus, the Hall effect switch device 10 has a distinct ON or OFF position without chatter or fluctuation due to a slow rate of change of the Hall voltage. The switching circuit 16 should further provide for hysteresis so that the ON and OFF positions are separated one from the other in order to avoid a similar ON and OFF fluctuation.

Referring now to FIG. 2, the Hall effect switch device 10 is shown diagrammatically as a switch 22 in the open position. The Hall effect switch device 10 has attached thereto a bias magnet 14 which preferably is a rubber magnet, since such a magnet is sufficiently strong to bias the Hall sensor 12 and may have its polarity readily reversed. The operating magnet 18 shown in FIG. 2 is implemented by any permanent magnet which has the capability to reverse the polarity of the bias magnet 14. In FIG. 2 the operating magnet 18 is shown in a position where it would be ineffective to reverse the polarity of the bias magnet 14, which has a North pole adjacent the Hall sensor to maintain the diagrammatic switch 22 in the open position.

In FIG. 3, the operating magnet 18 has been brought into a position where it has influenced a polarity change in the bias magnet 14, the bias magnet now having its south pole adjacent the Hall sensor 12. The diagrammatic switch 22 is thereby retained in the closed position. In FIG. 4, the operating magnet 18 is brought to a position where it does not influence bias magnet 14. The bias magnet 14 retains its polarity and the diagrammatic switch 22 remains closed.

In FIG. 5, the operating magnet 18 has been reversed and once again brought adjacent the bias magnet 14 to change the polarity thereof. The north pole is once again adjacent the Hall Sensor 12, the Hall sensor influencing the switching circuit 16 to open the diagrammatic switch 22. As in FIG. 4, the operating magnet 18 may be removed from the vicinity of the bias magnet 14 and the bias magnet will retain its polarity to insure that the switch 22 remains open.

Figure 1:
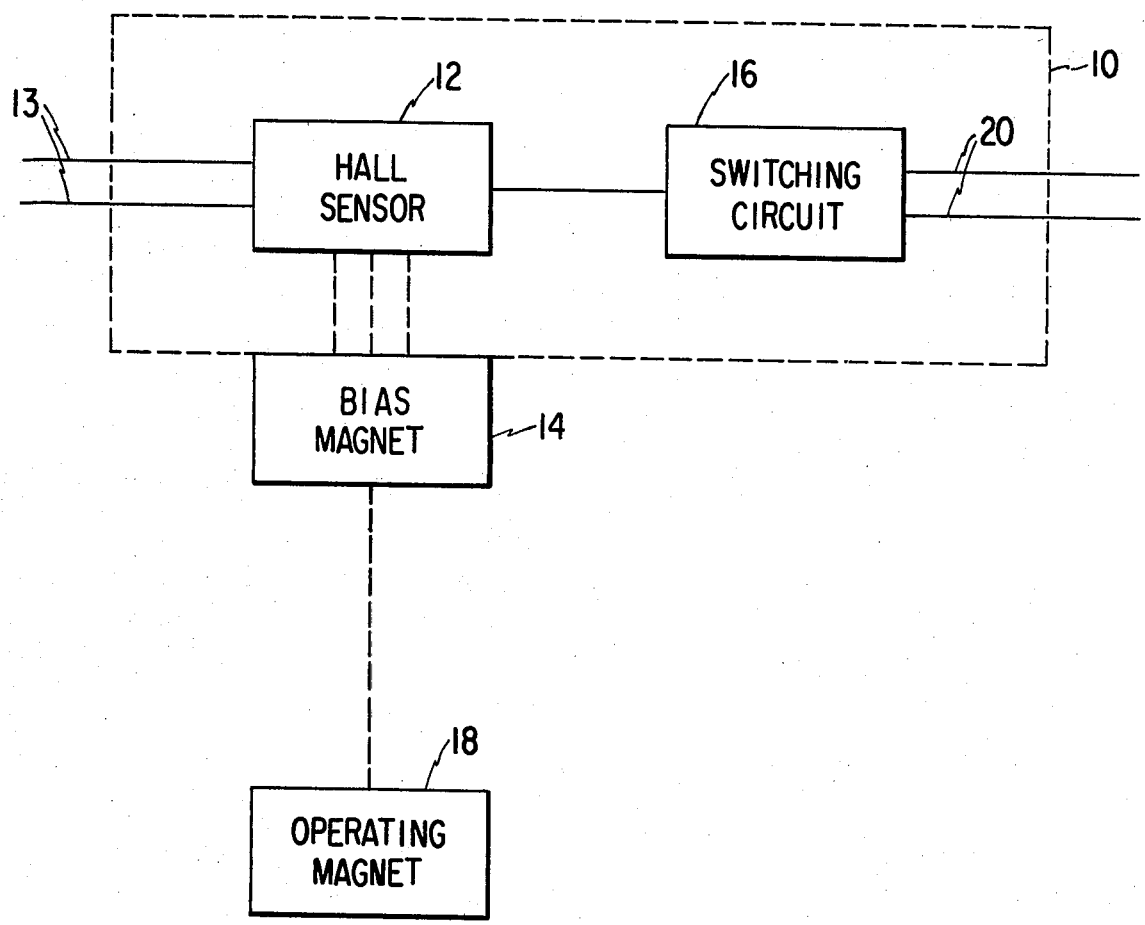
FIG. 1 represents, in block diagrammatic form, a latching relay utilizing a Hall effect device.

In FIGS. 6 and 7, there is shown operation of the Hall effect switch device and bias magnet 14 by means of an electromagnet 24 having a central iron core 26. A coil 28 extends about the core 26, and imposition of a DC current through the coil in the direction shown creates a bias on the bias magnet 14 which causes the switch 24 to be open. By reversing the direction of the current, a condition shown in FIG. 7, the electromagnet 24 is provided with a reverse polarity, which reverses the polarity of the bias magnet 14 and causes the switch 22 to close.

Thus has been shown a Hall effect switch device which is made into a latching relay by attaching a bias magnet to the Hall effect device adjacent the Hall sensor thereof so as to apply and retain a preferred magnetic field thereon. A switching circuit part of the Hall effect switch device provides for a specific switching function dependent upon the polarity of the bias magnet. By reversing the polarity of the bias magnet the converse of the switching function can be maintained. Thus, a relatively inexpensive latching relay may be implemented which utilizes an operating magnet to change the polarity of a bias magnet affixed to the Hall sensor, or an electromagnet supported adjacent the bias magnet with a polarity change being achieved by changing the direction of the current therethrough.

We claim:

1. A latching switch comprising:
a Hall effect digital switching device including a Hall sensor for generating an output voltage proportional to magnet field strength and means responsive to the output voltage generated by said Hall sensor for providing a switching function;
a reversible bias magnet supported with a pole thereof contiguous said Hall sensor for generating at one polarity, a first output voltage providing a switching function and at a reverse polarity a second output voltage providing a converse switching function; and,
means for reversing the polarity of said reversible bias magnet.

2. A latching switch comprising:
a Hall effect digital switching device for performing a switching function, said switching device including a Hall sensor for generating an output voltage proportional to magnetic field strength;
a reversible bias magnet having a pole thereof contiguous to the Hall sensor for causing generation thereby of one output voltage at a first polarity of said bias magnet for implementing a switching function and a second output voltage at the reversed polarity of said bias magnet for releasing said switching function; and,
means for reversing the polarity of said bias magnet.

3. A latching switch as claimed in claim 1 or claim 2 wherein said bias magnet is implemented by a rubber magnet, said rubber magnet being adhered to said Hall effect switch device adjacent said Hall sensor.

4. A latching switch as claimed in claim 3 wherein said reversing means is implemented by a permanent magnet of sufficient strength to reverse said bias magnet when contiguous said bias magnet and means for supporting said permanent magnet with a selected pole selectively contiguous said bias magnet.

5. A latching switch as claimed in claim 3 wherein said reversing means is implemented by a DC coil and a ferro magnetic core, said core having one end positioned adjacent said bias magnet, whereby reversing the current direction in said DC coil will reverse the polarity of said bias magnet.

6. A latching switch comprising:
a Hall effect digital switching device including a Hall sensor for generating an output voltage proportional to magnet field strength and means responsive to the output voltage generated by said Hall sensor for providing a switching function;
a reversible bias magnet supported with a pole thereof contiguous said Hall sensor for generating at a first polarity, one output voltage providing a switching function and generating at a reversed polarity a second output voltage providing a converse switching function.

* * * * *